United States Patent [19]
Seshan

[11] Patent Number: 5,862,159
[45] Date of Patent: Jan. 19, 1999

US005862159A

[54] PARALLELIZED CYCLICAL REDUNDANCY CHECK METHOD

[75] Inventor: Natarajan Seshan, Houston, Tex.

[73] Assignee: Texas Instruments Incorporated, Dallas, Tex.

[21] Appl. No.: 712,007

[22] Filed: Sep. 11, 1996

[51] Int. Cl.$^6$ ...................................................... G06F 11/10
[52] U.S. Cl. ....................... 371/53; 371/37.07; 371/37.6
[58] Field of Search .......................... 371/36, 37.8, 43.7, 371/43.1, 51.1, 43, 43.4, 37.1, 70, 55, 47.1, 46, 42, 37.07; 395/182.05, 568

[56] References Cited

U.S. PATENT DOCUMENTS

| | | | |
|---|---|---|---|
| 5,068,859 | 11/1991 | Collins et al. | 371/43 |
| 5,612,974 | 3/1997 | Astrachan | 375/295 |

OTHER PUBLICATIONS decaluse et al., "Interprocessor Communication in Synchronous Multiprocessor Digital Signal Processing Chips", IEEE, pp. 1816–1828, Dec. 1989.
Tozawa et al., "Low Cycle Skipping Rte SDP Modem For Every Small Earth Stations", IEEE, pp. 1100–1104, 1989.

*Primary Examiner*—Paul P. Gordon
*Assistant Examiner*—McDievnel Marc
*Attorney, Agent, or Firm*—J. Dennis Moore; James C. Kesterson; Richard L. Donaldson

[57] ABSTRACT

A method for encoding information bits to derive a cyclically encoded group of code bits from the information bits that were encoded, using a computer processor. A sequence of data states are generated that are the result of a series of exclusive OR operations of each of the code bits with each of the bits of a first generator word and bitwise ANDing each of the resultant bits with the results of the next previous such exclusive OR operations shifted in the direction of the least significant bit ("LSB") so as to generate a data state. The invention involves the following steps. First, an initial data state of zero is provided. Next, the LSB of the code bits is bitwise exclusive ORed with the current data state. Next, the result of the previous step is bitwise ANDed with the value n, where n is a selected binary value $2^x-1$, where x is any positive integer. Next, the current data state is changed to the next sequential data state by changing the data state to one of $2^x$ predetermined data states, depending on the x LSBs of the result of the previous step. Then, both the code bits and the now current data state are shifted by x bits in the direction of the LSB; and, finally, the second through fifth of the foregoing steps are repeated until all code bits have been operated on.

3 Claims, 1 Drawing Sheet

PARALLELIZED CYCLICAL REDUNDANCY CHECK METHOD

TECHNICAL FIELD OF THE INVENTION

This invention relates to Digital Signal Processors, and in particular relates to improved methods for the implementation of cyclical redundancy check ("CRC") algorithms.

BACKGROUND OF THE INVENTION

The use of cyclic codes to add redundancy for error detection and correction is a well known and much used technique in digital processing. One of the reasons for the favor of the cyclic redundancy check is that the encoding and decoding process is efficient because little, if any, storage is required. This is because the code words are generated by shifting and exclusive ORing ("XORing").

Nonetheless, the speed of computation of prior art techniques for cyclic encoding in digital processors is limited by the need for three processor operations for each bit processed, that is, a shift, an XOR and a compare. As digital data transmission rates increase, with improvements in technology, cyclic encoding in real time is becoming a problem. Without real time cyclic encoding, such encoding must be deferred, requiring, potentially, large amounts of memory. Furthermore, in some applications real time encoding may be a necessity.

Thus, there is a need for an approach to cyclic encoding that improves the speed of such computations. The present invention provides such an approach.

SUMMARY OF THE INVENTION

The present invention provides a method for encoding information bits to derive a cyclically encoded group of code bits from the information bits, using a computer processor. A sequence of data states are generated that are the result of a series of exclusive OR operations of each of the code bits with each of the bits of a first generator word and bitwise ANDing each of the resultant bits with the results of the next previous such exclusive OR operations shifted in the direction of the least significant bit ("LSB") so as to generate a data state. The invention involves the following steps. First, the LSB of the code bits is bitwise exclusive ORed with the current data state. Next, the result of the previous step is bitwise ANDed with the value n, where n is a selected binary value $2^x-1$, where x is any positive integer. Next, the current data state is changed to the next sequential data state by changing the data state to one of $2^x$ predetermined data states, depending on the x LSBs of the result of the previous step. Then, both the code bits and the now current data state are shifted by x bits in the direction of the LSB; and, finally, steps 1) through 4) are repeated until all code bits have been operated on.

Thus, the present invention, through novel paralellization techniques, enables the use of parallel processing of more than one bit, thus improving the speed of computation in cyclic encoding. The techniques involved in the present invention are suitable for implementation in software code operating on a processor, such as a digital signal processor, and are also suitable for implementation in dedicated hardware for even faster computation.

These and other features of the invention that will be apparent to those skilled in the art from the following detailed description of the invention, taken together with the accompanying drawings.

DETAILED DESCRIPTION OF THE INVENTION

Figure 1:
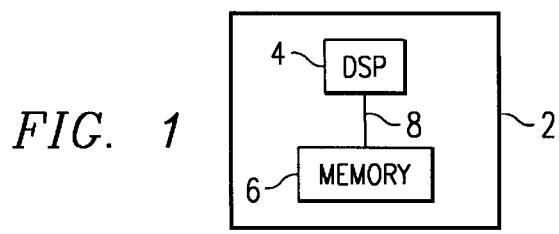
FIG. 1 is a block diagram of a computer subsystem including a digital signal processor.

The preferred embodiment of the present invention is implemented in a computer having a general purpose digital signal processor ("DSP"). FIG. 1 is a block diagram of a subsystem 2 of such a computer. The subsystem 2 generally includes a DSP 4 and a memory 6, which can include cache memory, as well as RAM memory and mass storage. The DSP 4 communicates with memory 6 by way of a data bus 8. The structure and operation of DSP subsystems such as subsystem 2 are well known in the art, and discussion of same is not included herein, in the interest of brevity and clarity. The preferred embodiment is a novel method of operating such a subsystem 2, wherein instructions stored in memory 6 are executed in DSP 4, and the discussion hereinbelow focuses on that method.

Figure 2:
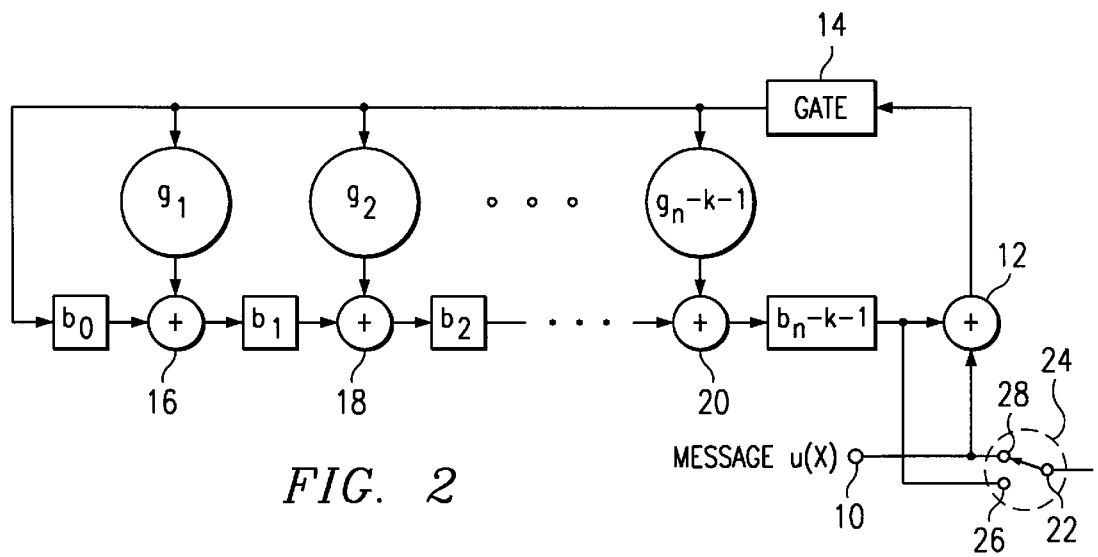
FIG. 2 is a diagram illustrating the data flow involved in the CRC process implemented by the preferred embodiment of the present invention.

FIG. 2 is a block diagram depicting the data flow for an encoding process in a digital computer for an (n, k) cyclic code with the generator polynomial of the following Formula (1):

$$g(X)=1+g_1X+g_2X^2+\ldots+g_{n-k-1}X^{n-k-1}+X^{n-k}$$

where:

k=the number of information bits.

n=the number of code bits in the code word, $X^{n-k}$=a place holder for bit n–k, and g=the set of code words, $g_0, g_1, g_2, \ldots g_{n-k-1}$ (the polynomial generator).

The process of FIG. 2 encodes an (n, k) cyclic code in systematic form, in three steps. First, the message polynomial u(X), comprising the k information bits $u_0, u_1, u_2, \ldots u_{k-1}$, is multiplied by $X^{n-k}$. Then, $X^{n-k}u(X)$ is divided by g(X) to obtain the remainder b(X). Finally, the code word $b(X)+X^{n-k}u(X)$ is formed. All these three steps are accomplished with the process of FIG. 2 which may be implemented as a linear (n–k)-stage shift register with feedback connections based on the generator polynomial in Formula (1), above, or, as is preferred, as a process running on a DSP.

As can be seen, the message u(X) is applied to the input 10 of the process serially, one bit at a time, and as it is so applied it is also provided as one input to a binary addition step 12. Data are generally clocked through the process of FIG. 2 one bit at a time. For example, the function of gate 14 is to hold one bit of data for one cycle for appropriate sequencing of the data flow in the process. The other input to the binary addition step 12 is the output $b_{b-k-1}$ of a final addition step, described below, that represents the most significant bit of the remainder b(X). The output of binary addition step 12 is provided to the input of gate 14. The output of gate 14 is, in turn, provided to the inputs of a series of multiplier steps $g_1, g_2, \ldots g_{n-k-1}$, in which the input thereto is multiplied by the code word for the position of the multiplier indicated by the subscript to the "g" term identifying the multiplier, and to the input of a first storage position $b_0$, as shown. Thus, for example, multiplier step $g_2$ multiplies its input by the code word $g_2$. Again, while the process is preferably implemented as a process running in a microprocessor, multiplier steps $g_1, g_2, \ldots g_{n-k-1}$, could be implemented in hardware, for example as AND gates, and storage positions $b_0, b_1, \ldots b_{b-k-1}$ could be implemented in hardware, for example as stages of a shift register. Also, the addition step 12 (as well as addition steps 16, 18 and 20, described below) could be implemented in hardware, for example as a binary adder, such as an exclusive OR gate. Actually, the provision of the output of gate 14 directly to the first storage position $b_0$ is equivalent to providing that output to multiplier step $g_0$, which is the value "1", which it will be in all generator polynomials useful for CRC encoding as described herein, and then providing that output to the first storage position $b_0$. The bit value in first storage position $b_0$, when the complete encoding operation is finished, is the first of the series, $b_0, b_1, b_2, \ldots b_{n-k-1}$, of parity check bits that are the result of the encoding process, and are the complete code vector for the block of information bits $u(X)$.

The output of the first storage position $b_0$ is provided to one input of a second binary addition step 16. The other input of binary addition step 16 is the output of multiplier step $g_1$. The output of the second binary adder 16 is provided to a second storage position $b_1$, the output of which is provided to one input of a third binary addition step 18, the other input of which is the output of multiplier step $g_2$, and the output of which is provided to a third storage position $b_2$, and so forth, as shown, until the output of storage position $b_{n-k-2}$ (not shown) is provided to one input of a binary addition step 20, the other input of which is the output of multiplier step $g_{n-k-1}$, and the output of which is provided to a final storage position $b_{n-k-1}$. As mentioned above, the output of the final storage position $b_{n-k-1}$ is provided to one input of the first binary addition step 12. It is also provided to output path 22 when data path selector 24 is in the appropriate position 26. The alternative position 28 for data path selector 24 passes data on the input path 10 straight through to the output path 22. This is simply reading out the parity bits. FIG. 2 shows data path selector 24 in the latter, alternative position 28. Note that data path selector 24 simply indicates data path where the process described above is implemented in a process on a microprocessor, but it could be implemented in hardware, for example, as a switch.

The three steps mentioned above will now be explained in more detail.

Step 1. With gate 14 turned on, the k information bits $u_0, u_1, u_2, \ldots u_{k-1}$ (or $u(X)=u_0+u_1X+\ldots u_{k-1}X^{k-1}$ in polynomial form) are shifted into the process and simultaneously into the communication channel. Shifting the message $u(X)$ into the process from the front end is equivalent to premultiplying $u(X)$ by $X^{n-k}$. As soon as the complete message has entered the process, the n-k digits in the storage locations form the remainder.

Step 2. The feedback connection is broken, by turning off gate 14.

Step 3. The digits $b_0, b_1, b_2, \ldots b_{n-k-1}$, together with the k information digits, form a complete code vector, or state, and can be shifted out through output path 22.

The CRC algorithm discussed above in connection with FIG. 2 can be described with the following code, referred to herein as the "CRC" code. Note that in this CRC code, as in the other sets of code set forth herein, individual line numbers appear immediately to the left of each line. Also, note that $b_0, b_1, b_2, \ldots b_{n-k-1}$ are reversed from the usual ordering, such that $b_0$ is the most significant bit ("MSB") and $b_{n-k-1}$ is the least significant bit ("LSB").

```
1    FOR i = 1 TO n
2        IF (((state ^ input) & 1 == 1) THEN
3            state = state ^ generator
4        ELSE
5            state = state
6        ENDIF
7        state = state >> 1
8        input = input >> 1
9    NEXT i
    where:
    "i" =           the ith bit of the input which is
                    being processed
    "input" =       an N-bit input word
    "state" =       the running state of the CRC, initialized
                    to the known value, zero
    "generator" =   an R-bit generator word
    "^" =           the bitwise exclusive-OR operation
    "&" =           the bitwise AND operation
    "==" =          the equality comparison
    ">>" =          a logical right-shift
    "A = B" =       store B into A.
```

In the foregoing code listing, the statement in line 3 thereof designates the instruction to multiply the state $b_0, b_1, b_2, \ldots b_{n-k-1}$ by the polynomial generator $g_0, g_1, g_2, \ldots g_{n-k-1}$. The input data is provided in sequence LSB to MSB. Thus the "newest" bit is the MSB, and the "oldest" bit is the LSB. Notationally, the generator coefficient $g_{n-k-1}$ is at the MSB position, while $g_0$ is at the LSB position.

The preferred embodiment of the present invention is implemented by the execution of a set of code instructions on a computer including a DSP, such as a Texas Instruments® TMS320C5x DSP, that are set forth and described in detail hereinbelow. In order to better understand the code of the preferred embodiment of the present invention, a series of sets of code are discussed that show a process of change from conventional, prior art code to the code of the preferred embodiment. These sets of code are presented in sequence and identified as "prior art," and then following the prior art code, "Example 1," "Example 2," and so forth. The final set of code is the code of the preferred embodiment, and is identified as such. Note that text following a semicolon, such as appears in lines 1 and 11 of the code of Example 1, is comment text that is not executed or otherwise operated on.

Thus, the first set of code, that of the prior art, is now presented:

```
1    FOR i = 1 to N              ; for each bit in the input
2        temp1 = state ^ input
3        temp2 = temp1 & 1
4        IF (temp2 == 1) THEN
5            temp3 = state ^ generator
6        ELSE
7            temp3 = state
8        ENDIF
9            state = temp3 >> 1
10           input = input >> 1
11   NEXT i                      ; the next input bit where:   temp1–temp3 are temporary values, and
             other variables are as in the CRC code.
```

Figure 3:
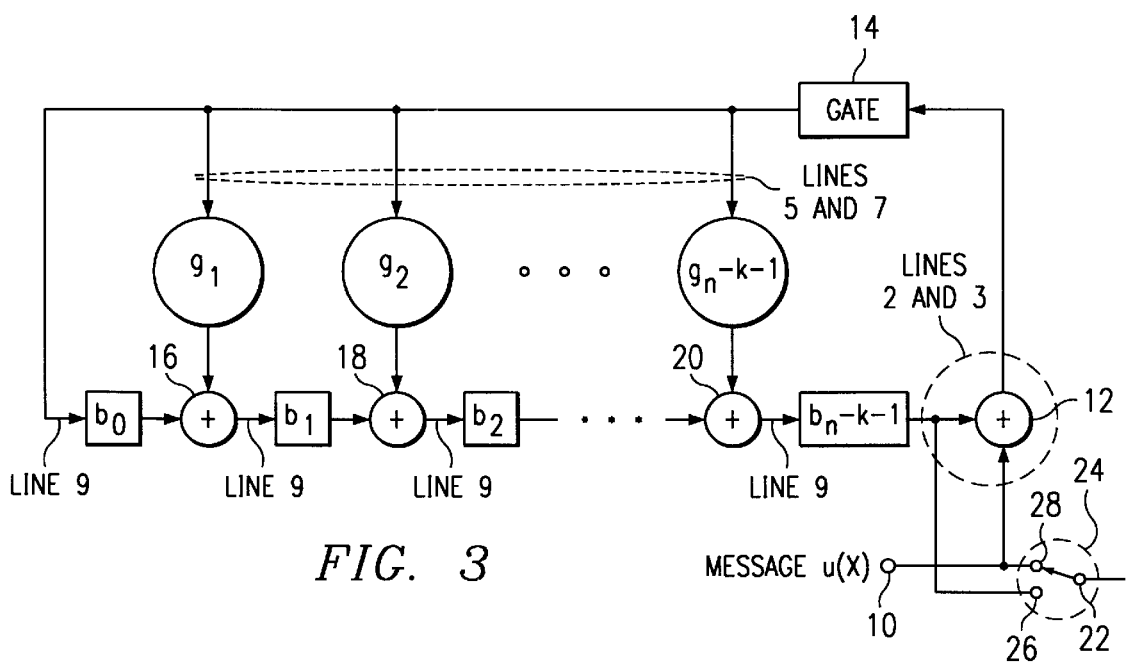
FIG. 3 is a diagram similar to that of FIG. 1, but showing where certain portions of the method of the preferred embodiment of the present invention are performed.

Notice that in the prior art code above, six steps are necessary to implement the algorithm, set forth in lines 2, 3, 4, 5 (and 7), 9 and 10. Also notice that steps 2 through 10 constitute a loop recurrence. In other words, the next iteration of the loop has that sequence of steps as a constraint. FIG. 3 shows the "location" of the steps in the prior art code listing in the process of FIG. 2. Thus, lines 2 and 3 are implemented in the addition step 12, lines 5 and 7 are implemented in the multiplier steps $g_1, g_2, \ldots g_{n-k-1}$, and line 9 is implemented in the shifts into the storage positions $b_0$, $b_1, \ldots b_{b-k-1}$, all as shown in FIG. 3.

Note that a particular iteration's steps 5 and 7 must complete before the next iteration's step 2 may begin, because step 2 relies on the state calculated by the previous iteration. Therefore, at best any processor capable of performing the steps of the prior art code must take at least four steps per bit.

Now, the next set of code, that of Example 1, is presented and described.

```
1   FOR i = 1 TO N STEP 2
2       IF (((state ^ input) & 1) == 1) THEN
3           state = state ^ generator
4       ELSE
5           state = state
6       ENDIF
7       state = state >> 1
8       input = input >> 1
9       IF (((state ^ input) & 1) == 1) THEN
10          state = state ^ generator
11      ELSE
12          state = state
13      ENDIF
14      state = state >> 1
15      input = input >> 1
16  NEXT i
```

Note that the code of Example 1 performs two iterations at a time. However, the recurrence is now in the steps of lines 2–3, 5, 7 and 8, and in the steps of lines 9–10, 12, 14 and 15, respectively. This requires eight steps per two bits.

Now, the next set of code, that of Example 2, is presented and described.

```
1   FOR i = 1 TO N STEP 2
2       IF (((state ^ input) & 1) ==1) THEN
3           state = state ^ generator
4           state = state >> 1
5           input = input >> 1
6           IF ((state ^ input) & 1) == 1) THEN
7               state = state ^ generator
8           ELSE
9               state = state
10          ENDIF
11          state = state >> 1
12          input = input >> 1
13      ELSE
14          state = state
15          state = state >> 1
16          input = input >> 1
17          IF (((state ^ input) & 1) == 1) THEN
18              state = state ^ generator
19          ELSE
20              state = state
21          ENDIF
22          state = state >> 1
23          input = input >> 1
24      ENDIF
25  NEXT
```

Note that the IF/ELSE pair in lines 2 and 13 represent the IF/ELSE pair of lines 2 and 4 of Example 1. The steps set forth in lines 7 through 15 of Example 1 are split out into two sets of subroutines in Example 2, the first being set forth in lines 4 through 12, and the second being set forth in lines 15 through 23, that is, placed in both the IF path starting at line 2 and the ELSE path starting at line 13.

Now, the next set of code, that of Example 3, is presented and described.

```
1   FOR i = 1 TO N STEP 2
2       IF (((state ^ input) & 1) ==1) THEN
3           state = state ^ generator
4           IF ((((state >>1) (input >> 1)) & 1) ==
5                   1) THEN
6               state = (state >>1) ^ generator
7           ELSE
8               state = (state >> 1)
9           ENDIF
10      ELSE
11          state = state
12          IF ((((state >> 1) ^ (input >> 1)) & 1)
13                  == 1) THEN
14              state = (state >> 1) ^ generator
15          ELSE
16              state = (state >> 1)
17          ENDIF
18      ENDIF
19      state = state >> 1
20      input = input >> 2
21  NEXT
```

Note that the first shift term, state >>1, of Example 2 is distributed by being substituted into lines 4, 6, 8, 12, 14 and 16 of Example 3. The second shift term, input >>1, is distributed by being substituted into lines 4, 12 and 20. Note that the substitution into 20 results in a shifting by 2, instead of by 1.

Now, the next set of code, that of Example 4, is presented and described.

```
1   FOR i = 1 TO N STEP 2
2       IF (((state ^ input) & 1) ==1) THEN
3           IF ((((state ^ generator) >>1) ^
4                   (input >>1) & 1) ==1 THEN
5               state = ((state ^ generator) >>1) ^
6                   generator
7           ELSE
8               state = ((state ^ generator) >>1)
9           ENDIF
10      ELSE
11          IF ((((state >> 1) ^ (input >> 1)) & 1)
12                  == 1) THEN
13              state = (state >> 1) ^ generator
14          ELSE
15              state = (state >> 1)
16          ENDIF
17      ENDIF
18      state = state >> 1
19      input = input >> 2
20  NEXT
```

Note that in Example 4, the state ^ generator term has been distributed, as compared with Example 3.

Now, the next set of code, that of Example 5, is presented and described.

```
1   FOR i = 1 TO N STEP 2
2       IF (((state ^ input) & 1) ==1) THEN
3           IF ((((state ^ generator ^ input) >>1) &
4                   1) == 1) THEN
5               state = ((state ^ generator ^
6                   (generator <<1)) >>1
7           ELSE
8               state = ((state ^ generator) >>1)
9           ENDIF
10      ELSE
11          IF ((((state ^ input) >> 1) & 1) == 1)
12              THEN
13              state = (state ^ (generator >>
14                  1)) >> 1
15          ELSE
```

```
16          state = state >> 1
17      ENDIF
18    ENDIF
19    state = state >> 1
20    input = input >> 2
21  NEXT
```

Note that in Example 5 a kind of "reverse distribution" is done, compared with Example 4. That is, terms are consolidated. For example, lines 3–4 of Example 4, IF ((((state ^ generator)>>1)^(input>>1) & 1)==1 THEN becomes lines 3–4 of Example 5:

IF ((((state ^ generator ^ input)>>1) & 1)==1) THEN.

Other terms are similarly consolidated in Example 5.

Now, the next set of code, that of Example 6, is presented and described.

```
1   FOR i = 1 TO N STEP 2
2     IF (((state ^ input) & 1) == 1) THEN
3       IF ((((state ^ generator ^ input) >> 1) &
4           1) == 1) THEN
5             state = state ^ generator ^
6                 (generator >> 1)
7       ELSE
8             state = state ^ generator
9       ENDIF
10    ELSE
11      IF ((((state ^ input) >> 1) & 1) == 1)
12        THEN
13            state = state ^ (generator >>
14                1)
15      ELSE
16            state = state
17      ENDIF
18    ENDIF
19    state = state >> 2
20    input = input >> 2
21  NEXT
```

Note that in Example 6 the term state >>1 is factored out and performed in line 19, where the combination of terms results in a shift by 2.

Now, the next set of code, that of Example 7, is presented and described.

```
1   FOR i = 1 TO N STEP 2
2     IF (((state ^ input) & 1) == 1) THEN
3       IF ((((state ^ input) >> 1) & 1) == 0)
4         THEN
5             state = state ^ generator ^
6                 (generator >> 1)
7       ELSE
8             state = state ^ generator
9       ENDIF
10    ELSE
11      IF ((((state ^ input) >> 1) & 1) == 1)
12        THEN
13            state = state ^ (generator >>
14                1)
15      ELSE
16            state = state
17      ENDIF
18    ENDIF
19    state = state >> 2
20    input = input >> 2
21  NEXT
```

Note that in Example 7, with regard to the change to line 3, a transformation is made, compared to the same statement in lines 3–4 of Example 6, based on certain knowledge of the generator. The transformation is made operating on the assumption that the generator inverts the result of the test, because the LSB of the generator is 1. Thus, the generator is removed, and the test value for comparison inverted to "0". Compare line 11 of Example 7, where the test is not inverted, because the term state ^ input was not ^ed with the generator.

Now, the next set of code, that of Example 8, is presented and described.

```
1   FOR i = 1 TO N STEP 2
2     IF (((state ^ input) & 3) == 1) THEN
3         state = state ^ generator ^ (generator <<
4             1)
5     ENDIF
6     IF (((state ^ input) & 3) == 3) THEN
7             state = state ^ generator
8     ENDIF
9     IF ((((state ^ input ) & 3) == 2) THEN
10        state = state ^ (generator >> 1)
11    ENDIF
12    IF (((state ^ input) & 3) == 0) THEN
13        state = state
14    ENDIF
15    state = state >> 2
16    input = input >> 2
17  NEXT
```

Note that in Example 8 the tests are combined in nested IF/THEN statements, dealing with the now resulting four different possibilities, that is, 0, 1, 2 or 3 (binary 00, 01, 10, 11, respectively), for the MSBs, as the shifting is now done by two bits, instead of one bit, as in Example 1. This reduces the number of lines.

Now, the next set of code, that of Preferred Embodiment, is presented and described.

```
1   FOR i = 1 TO N STEP 2
2       temp1 = (state ^ input)              ; step 1
3       temp2 = temp1 & 3                    ; step 2
4       IF (temp2 == 1) THEN                 ; step 3a
5           state = state ^ generator 3      ; step 4a
6       ENDIF
7       IF (temp2 == 3) THEN                 ; step 3b
8           state = state ^ generator        ; step 4b
9       ENDIF
10      IF (temp2 == 2) THEN                 ; step 3c
11          state = state ^ generator2       ; step 4c
12      ENDIF
13      IF (temp2 == 0) THEN                 ; step 3d
14          state = state                    ; step 4d
15      ENDIF
16      state = state >> 2                   ; step 5a
17      input = input >>2                    ; step 5b
18  NEXT                                     i
```

The code in the preferred embodiment expresses the code of Example 8 in 2-operand steps, so that a processor can perform them. Certain temporary variables are introduced here. Thus, generator 3=generator ^ generator<<1 and generator 2=generator<<1.

In both Example 8 and in the preferred embodiment, m bits of the CRC are operated on in parallel. Also, tests on m bits of the input ^ state are tested simultaneously. In addition, there are $2^m$ possible results of the tests, and there are $2^m$ new generators, generator 3, generator 2, generator and 0, to compute the next state b. The generators are constants and can be built from the 1-bit-at-a-time generator. Since the term, generator, is a constant, one can predict how the results of the $2^m$ tests map to the new generator.

Thus, the present invention, through novel paralellization techniques, enables the use of parallel processing of more than one bit, thus improving the speed of computation in cyclic encoding. The techniques involved in the present invention are suitable for implementation in software code operating on a processor, such as a digital signal processor, and are also suitable for implementation in dedicated hardware for even faster computation.

Although the present invention and its advantages have been described in detail, it should be understood that various changes, substitutions and alterations can be made herein without departing from the spirit and scope of the invention as defined by the appended claims.

What is claimed is:

1. In a computer, having memory and a processor, a method for encoding information bits to derive a cyclically encoded group of code bits by generating a sequence of data states that are the result of a series of exclusive OR operations of each of the information bits with each of the bits of a first generator word and bitwise ANDing each of the resultant bits with the results of the next previous such exclusive OR operations shifted in the direction of the least significant bit ("LSB") so as to generate a data state, comprising the steps of:

1) providing an initial data state of zero in said memory;
2) using said processor, bitwise exclusive ORing the LSB of the information bits with the current data state;
3) using said processor, bitwise ANDing the value n with the result of the previous step, where n is a selected binary value $2^x-1$, where x is any positive integer;
4) using said processor, changing the current data state to the next sequential data state by changing the data state to one of $2^x$ predetermined data states, depending on the x LSBs of the result of step 3);
5) using said processor, shifting both the information bits and the now current data state by x bits in the direction of the LSB, reading out the x LSBs of the current data state as x code bits; and
6) repeating steps 2) through 5) until all information bits have been operated on.

2. In a computer, having memory and a processor, a method for encoding information bits to derive a cyclically encoded group of code bits by generating a sequence of data states that are the result of a series of exclusive OR operations of each of the information bits with each of the bits of a first generator word and bitwise ANDing each of the resultant bits with the results of the next previous such exclusive OR operations shifted in the direction of the least significant bit ("LSB") so as to generate a data state, comprising the steps of:

1) providing an initial data state of zero in said memory;
2) using said processor, bitwise exclusive ORing the LSB of the information bits with the current data state;
3) using said processor, bitwise ANDing the value 3 with the result of the previous step;
4) using said processor, changing the current data state to the next sequential data state by changing the data state to one of four predetermined data states, depending on whether the two LSBs of the result of step 3) are 0, 1, 2 or 3, respectively;
5) using said processor, shifting both the information bits and the now current data state by two bits in the direction of the LSB, reading out the two LSBs of the current data state as two code bits; and
6) repeating steps 2) through 5) until all information bits have been operated on.

3. In a computer, having memory and a processor, a method for encoding information bits to derive a cyclically encoded group of code by generating a sequence of data states that are the result of a series of exclusive OR operations of each of the information bits with each of the bits of a first generator word and bitwise ANDing each of the resultant bits with the results of the next previous such exclusive OR operations shifted in the direction of the least significant bit ("LSB") so as to generate a data state, comprising the steps of:

1) providing an initial data state of zero in said memory;
2) providing an additional three generator words, the first being the value zero, the second being said generator word shifted by one in the direction of the LSB, and the third being the result of the exclusive ORing of said generator word with said second generator word;
3) exclusive ORing the current data state with the LSB of the information bits to derive a first intermediate value;
4) bitwise ANDing the first intermediate value with the value 3 to derive a second intermediate value;
5a) if said second intermediate value is equal to the value 1 then generating the next sequential data state by exclusive ORing the current state with said third generator word;
5b) if said second intermediate value is equal to the value 3 then generating the next sequential data state by exclusive ORing the current state with said first generator word;
5c) if said second intermediate value is equal to the value 2 then generating the next sequential data state by exclusive ORing the current state with said second generator word;
5d) if said second intermediate value is equal to the value 0 then generating the next sequential data state by leaving it the same as the current data state; then
6) shifting said information bits by two bits in the direction of the LSB;
7) shifting the now current data state by two bits in the direction of the LSB, reading out the two LSBs of the current data state as two code bits; and
8) repeating steps 2) through 7) until all information bits have been operated on.

* * * * *